United States Patent [19]

Bhatt et al.

[11] Patent Number: 5,578,796
[45] Date of Patent: Nov. 26, 1996

[54] APPARATUS FOR LAMINATING AND CIRCUITIZING SUBSTRATES HAVING OPENINGS THEREIN

[75] Inventors: Ashwinkumar C. Bhatt; Thomas P. Duffy, both of Endicott; Gerry A. Hackett, Apalachin; Jeffrey McKeveny, Endicott, all of N.Y.

[73] Assignee: International Business Machines Corporation, Armonk, N.Y.

[21] Appl. No.: 466,081

[22] Filed: Jun. 6, 1995

Related U.S. Application Data

[62] Division of Ser. No. 359,491, Dec. 20, 1994, Pat. No. 5,542,175.

[51] Int. Cl.⁶ ................... H05K 1/18; H05K 1/02
[52] U.S. Cl. ............ 174/260; 174/252; 361/761; 361/764; 361/794; 361/792
[58] Field of Search ................... 174/260, 261, 174/262, 266, 255, 250, 252; 361/760, 761, 764, 767, 772, 794, 784, 792

[56] References Cited

U.S. PATENT DOCUMENTS

| | | | |
|---|---|---|---|
| 4,539,622 | 9/1985 | Akasaki et al. | 361/401 |
| 4,630,172 | 12/1986 | Stenerson et al. | 361/386 |
| 4,633,573 | 1/1987 | Scherer | 29/589 |
| 4,705,917 | 11/1987 | Gates, Jr. et al. | 174/52 FP |
| 4,882,212 | 11/1989 | SinghDeo et al. | 428/76 |
| 4,975,761 | 12/1990 | Chu | 357/72 |
| 5,041,899 | 8/1991 | Oku et al. | 357/74 |
| 5,155,067 | 10/1992 | Wood et al. | 437/209 |
| 5,235,496 | 8/1993 | Chomette et al. | 361/764 |
| 5,241,456 | 8/1993 | Marcinkiewicz et al. | 361/792 |
| 5,291,062 | 3/1994 | Higgins, III | 257/698 |
| 5,324,888 | 6/1994 | Tyler et al. | 174/52.2 |

FOREIGN PATENT DOCUMENTS

| | | |
|---|---|---|
| 2-237142 | 9/1990 | Japan. |
| 5-211256 | 8/1993 | Japan. |

OTHER PUBLICATIONS

"IBM Technical Disclosure Bulletin," vol. 27, No. 2; Jul., 1984; p. 1139.

*Primary Examiner*—Laura Thomas
*Attorney, Agent, or Firm*—Calfee, Halter & Griswold

[57] ABSTRACT

According to the present invention, a method of laminating at least two substrates together and circuitizing at least one surface of the laminate is provided. Pressure is exerted against opposite surfaces of each of said two substrates. An opening extends from a circuit-receiving surface of at least one of said substrates. A plug is provided which is configured to removably fit into said opening and has a support surface thereon which is substantially coplanar with the circuit-receiving surface when said plug is positioned in the opening. The plug is inserted in the opening with the support surface substantially coplanar with the circuit-receiving surface. The substrates are laminated by application of pressure on the opposite surfaces of the substrates. The circuit-receiving surface and the support surface are covered with a sheet of dry film photoresist to seal around the opening with said plug member supporting said sheet of photoresist in the region of the opening. The dry film resist material is patterned and developed in a predetermined pattern, and the surface is circuitized with electrical circuitry. Any remaining photoresist is stripped, and said plug member is removed.

10 Claims, 3 Drawing Sheets

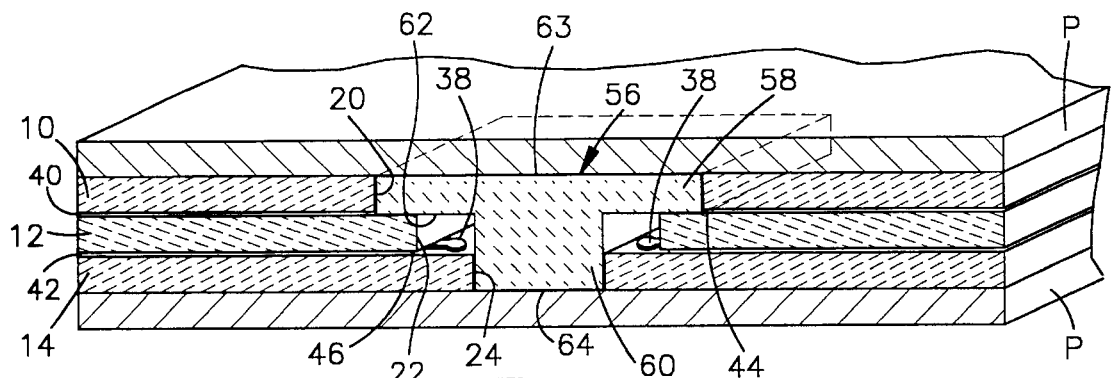
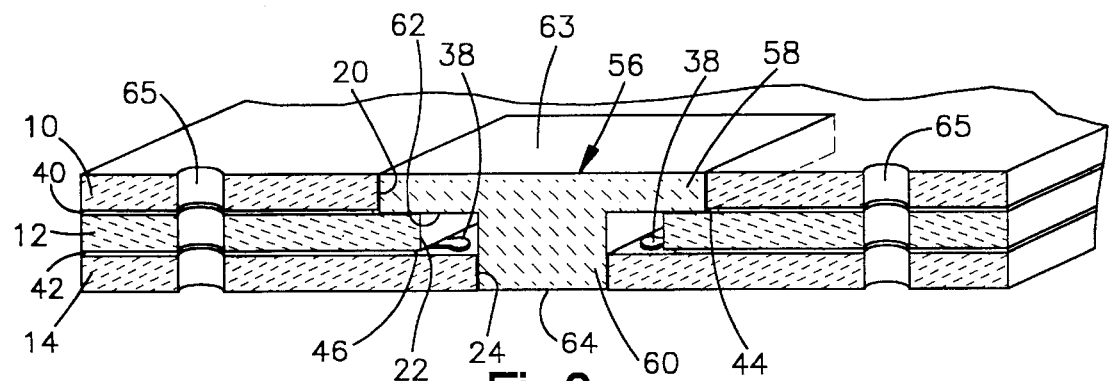
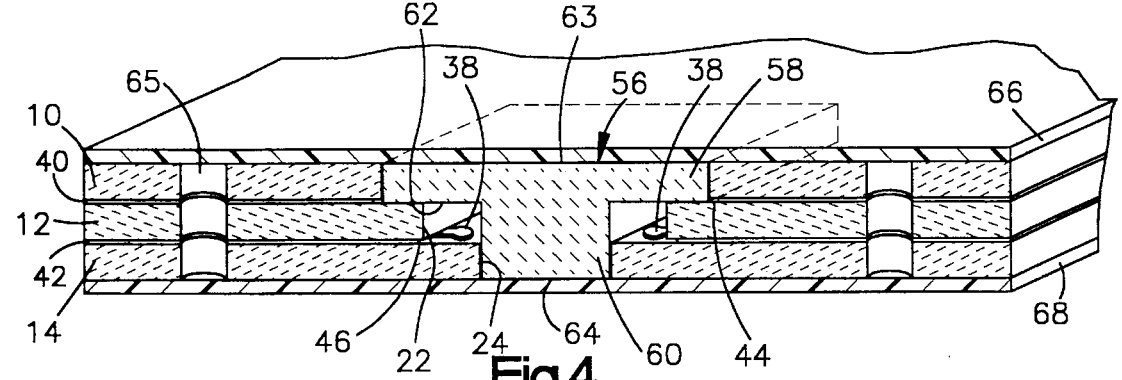
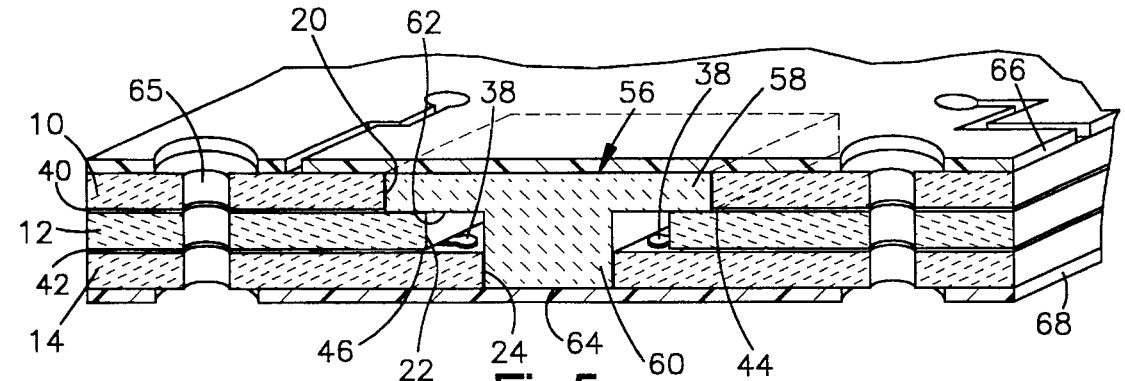

APPARATUS FOR LAMINATING AND CIRCUITIZING SUBSTRATES HAVING OPENINGS THEREIN

This is a divisional of application Ser. No. 08/359,491, filed on Dec. 20, 1994, now U.S. Pat. No. 5,542,175.

FIELD OF THE INVENTION

This invention relates generally to laminating and circuitizing substrates. More specifically, this invention relates to an improved technique for forming either chip carriers of single chip module laminates (SCML) or multi-chip module laminates (MCML) which have openings therein for the reception of integrated circuit chips. In particular, this invention is especially useful in forming SCMLs and MCMLs using organic circuit board technology of the type known as FR4 and other epoxy-fiberglass board technology.

BACKGROUND INFORMATION

In forming circuit boards, for use especially in computers, it is necessary to mount various components onto a substrate. Among these components are integrated circuit (I/C) chips. Various techniques have been developed for mounting integrated circuit chips onto circuit boards. One technique is the so-called "direct chip attach" (DCA), in which chips are mounted along with other components directly onto the circuit board or mother board of the computer. While this type of mounting does have certain attractive aspects, nevertheless there are some serious limitations to direct chip attach. These limitations include the thermal mismatch of silicon chips with the circuit board which is typically formed of epoxy fiberglass FR4 technology and which has a significantly different coefficient of thermal expansion (CTE) from that of the integrated circuit chip which typically is made of silicon. Moreover, there is a problem of reworking the circuit board in case of defective chips, which in the extreme case can result in totally scrapping the circuit board at the end of the manufacturing process due to malfunctioning or other problems with a single integrated circuit chip.

For the above and other reasons, one very common technique for attaching integrated circuit chips to circuit boards is by the use of chip carriers, which chip carriers mount the integrated circuit chips, and which carriers in turn are mounted to the circuit board. While this introduces another level of packaging, nevertheless there are certain advantages to this type of chip mounting which, in some instances, make it a more desirable mode of chip attach. In this technique, the integrated circuit chip is secured to a chip carrier either by solder ball connections or wire bonding, and the chip carrier, with one or more chips attached thereto is then attached to the circuit board by various different technologies such as pin-in-hole, solder ball or wire bonding techniques. This has the advantage of allowing the chips to be tested individually or in small groups on individual chip carriers and, if there is a defective or malfunctioning chip, that chip can be easily replaced or, if not replaced, the chip and the carrier can be discarded without discarding or scrapping the entire circuit board at a late state in processing. This technique also allows for greater tolerance to thermal mismatch between the chip and the chip carrier for several reasons.

In one technique, a carrier material can be selected which has a coefficient of thermal expansion between that of the silicon of the integrated circuit chip and the organic epoxy fiberglass material of the circuit board. One such type of carrier is ceramic carriers, which are well known in the art.

Another factor in creating or minimizing the consequences of thermal mismatch between the chip and the circuit board material is that the chip carrier itself is relatively small as compared to the circuit board, and thus the effect of the thermal mismatch vis-a-vis the chip is significantly reduced as compared to situations where there is direct chip attach with a relatively small integrated circuit chip and a relatively large circuit board. Thus, a technique for mounting chips on carriers and carriers to circuit boards has been developed in which the same material is used both for the chip carrier and the circuit board, which in many instances is FR4 epoxy fiberglass material. By using the same material for both the chip carrier and the circuit board, essentially the same technologies can be used for forming both the chip carriers and the circuit board material, thereby reducing the number of technologies necessary to provide a finished product.

Technologies used to form epoxy fiberglass FR4 material into chip carriers include, among other things, the lamination of several layers of the FR4 or organic board together to form the chip carrier and also include photolithographic technologies where photoresist (either positive acting or negative acting) is used either to pattern the material for either subtractive or additive circuitization. In the technologies for manufacturing SCML and MCML chip carriers, because of their configurations, both of these processes can have certain detrimental effects on the manufacturing process which can lead to causing significant problems with the resultant chip carrier to the extent that it is unsatisfactory for its intended use. Thus, it is desirable to eliminate these problems in the FR4 board technology.

Moreover, certain of these problems are encountered not only in FR4 board technology, but in other types of technology such as ceramics for forming chip carriers' in which the photoresist process is utilized to form chip carriers, and thus, it would be desirable to eliminate the problems associated with the photoresist process in these other types of carrier technologies.

SUMMARY OF THE INVENTION

A method of laminating at least two substrates together and circuitizing at least one surface of the laminate is provided. The method includes exerting pressure against opposite surfaces of each of said two substrates. There is an opening extending from a circuit-receiving surface of at least one of said substrates. A plug is provided which is configured to removably fit into the opening and has a support surface thereon which is substantially coplanar with the circuit receiving surface when said plug is positioned in said opening. The plug is inserted in said opening with the support surface substantially coplanar with the circuit-receiving surface. The substrates are laminated by application of pressure on the opposite surfaces of the substrates. At least a portion of said circuit-receiving surface and the support surface are covered with a sheet of dry film photoresist to seal around the opening with said plug member supporting the sheet of photoresist in the region of the one opening. The dry film resist material is patterned and developed to form a predetermined pattern on the circuit-receiving surface which is then circuitized. Thereafter, any remaining photoresist is stripped, and the plug member is removed.

DESCRIPTION OF THE DRAWINGS

FIG. 3 is a longitudinal sectional view of the laminated product;

FIG. 4 is a longitudinal sectional view similar to FIG. 3 of the laminated structure having been assembled with photoresist in preparation for photolithography;

FIG. 5 is a view similar to FIG. 4 showing the photoresist exposed and developed;

DESCRIPTION OF THE PREFERRED EMBODIMENT(S)

Before describing the process in detail, it should be noted that the preferred embodiment of the present invention constitutes a process for forming a single chip module laminate (SCML) utilizing epoxy fiberglass technology known as FR4 organic circuit board technology. Certain of the aspects of the present invention are specifically applicable to this type of technology in which lamination takes place that results in viscous flow of material such as the epoxy-impregnated fiberglass sheets (prepreg) used to join the various laminates which are used in SCML and multi-chip module laminate (MCML). However, other aspects of this invention, such as the technique of supporting the photoresist with a plug member during the photolithographic operations is generally applicable to many different types of technologies and several different materials utilized for forming chip carriers, such as ceramics.

Figure 1:
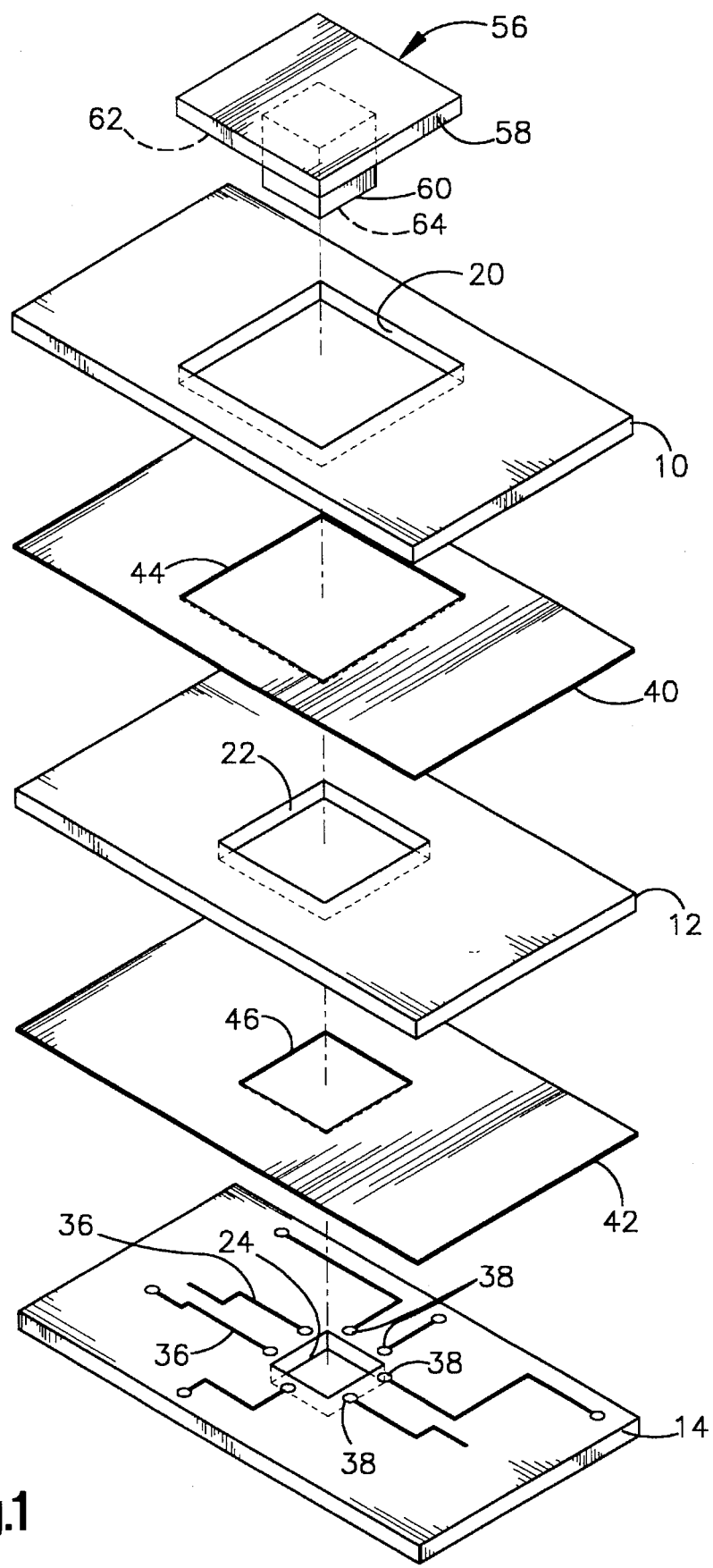
FIG. 1 is a perspective exploded view, somewhat diagrammatic, showing the various layers of a single chip module laminate structure and the insert prepared and ready for lamination of the components.

Referring now to the drawings, and for the present to FIG. 1, various components for forming an SCML chip carrier are shown, somewhat diagrammatically and in an exploded configuration, ready to be assembled to form the structure according to the present invention. The SCML in this embodiment is comprised of three segments of circuit board 10, 12 and 14. These three segments are laminated together according to the technique of the present invention to form a single chip multi-laminate chip carrier as will be described. Each of the segments 10, 12 and 14 is itself, in effect, a miniature or small circuit board; i.e., the segments 10, 12 and 14 are each multi-layered organic circuit boards formed of layers of epoxy-impregnated fiberglass cloth having electrical circuitry sandwiched therein and laminated to form a miniature "circuit board". Thus, each segment is a cured epoxy fiberglass FR4 "circuit board" structure, but of the size of a chip carrier, and formed using conventional FR4 technology. Typically, each of the segments 10, 12 and 14 is comprised of up to seven layers or more of organic FR4 material with the appropriate electrical circuitry therein to form the necessary electrical connections between a chip mounted on the carrier and a pad for attaching the circuit board as will be described presently. Typically, each of these segments is about 0.025" thick, although the bottom segment 14 may in some cases be somewhat thicker, e.g. 0.030". The segment 10 has a chip-receiving opening 20 therein, segment 12 has a chip-receiving opening 22 therein, and segment 14 has a chip-receiving opening 24 therein. When in stacked configuration, these openings are aligned with the opening 20 being larger than the opening 22, and the opening 22 being larger than the opening 24, for a purpose which will be described presently. Generally speaking, the opening 20 is about 1 inch square, with the opening 22 being about 0.050" smaller, and the opening 24 about 0.050" smaller than the opening 22. However, the sizes of these openings are dependent upon the size of the chip to be attached and will vary depending upon the physical size of whatever chip is to be attached thereto.

The segments 10, 12 and 14 as indicated above have internal electrical circuitry (not shown) which can be interconnected by means of vias or plated-through holes as will be described presently. It is to be understood that the segments 10, 12 and 14 are shown very diagrammatically and that there would typically be many more through holes and much denser circuitry than that which will be shown presently, the depiction of FIG. 1 being merely illustrative of the configuration.

The segment 14 has circuitry 36 on the surface thereof which includes chip mounting pads 38 which are arranged around the opening 24 in the pattern to allow the chip to be attached by wire bonding. This particular configuration is designed to mount an I/C chip, as will be explained presently.

Since the segments 10, 12 and 14 are fully cured glass-impregnated epoxy resin organic boards, the preferred technique of laminating these together is by the use of epoxy-impregnated fiberglass strips 40, 42. Strips of fiberglass are impregnated with a selected epoxy and partially cured to form a solid sheet of material, which curing, referred to as a "B" cure, results in a partially polymerized epoxy impregnated in the fiberglass cloth. The strips 40, 42 in this form are often referred to as "prepreg". The B cured prepreg is about 2–3 mils thick. The epoxy in this state will flow under heat and pressure, which heat and pressure will result in a fully cured epoxy. These strips 40, 42 of prepreg are conventionally used in laminating procedures between substrates of fully cured fiberglass filled epoxy, which will join the various layers of substrates to form a fully cured board and which techniques are well known in the art. This technique is well known in the art.

One of the strips 40 is interposed between the boards 10 and 12, and another of the strips 42 is interposed between the segments 12 and 14. The strip 40 has a central opening 44 which is slightly larger (e.g., about 10–15 mils larger) than the opening 20 in the segment 10, and the strip 42 has a central opening 46 which is slightly larger (e.g., about 10–15 mils larger) than the opening 22 for a purpose which will be described presently. It is to be understood that the openings 20, 22 and 24, as well as the openings 44 and 46 are in alignment when the segments 10, 12 and 14 and strips 40 and 42 are laid up in superimposed relationship with respect to each other.

Figure 2A:
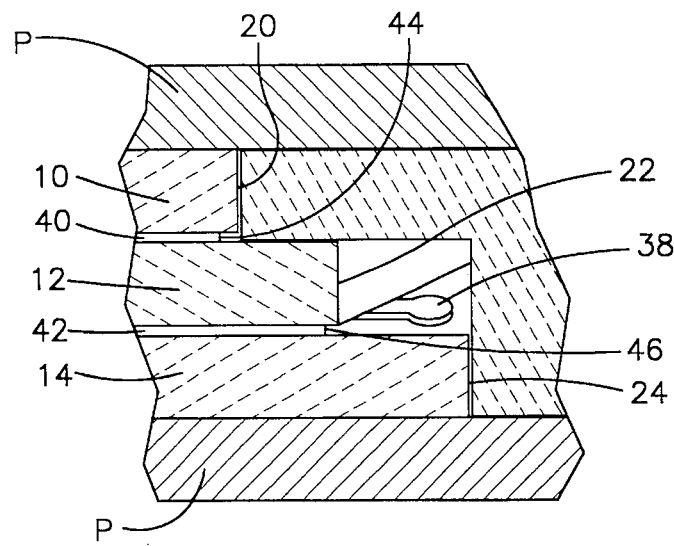
FIG. 2 is a longitudinal sectional view of the components of FIG. 1 assembled in position for lamination.

To form the laminated structure, the segments 10, 12 and 14, as well as the strips 40 and 42, are aligned and superimposed with respect to each other as shown in the configuration of FIG. 2. As can best be seen in FIG. 2A, the edge of the glass strip 40 around the opening 44 is slightly larger than the opening 20 in the segment 10. This will allow a slight amount of flow of the epoxy around the opening 20 of segment 10 for a purpose which will be explained presently. Also, the edge of the glass strip 42 around the opening 46 therein is spaced back from the edge of the opening 22 of the segment 12. As will be explained, this is to prevent the material from the glass strip 42 running over and completely covering the bonding pads 38 on top of the segment 14. In a typical embodiment, the opening 22 is sufficiently wider than the opening 24 to allow the bonding pads 38 to extend out from the edge of the opening 22 by about 50–60 mils, and the edge of the opening 46 of the strip 42 is spaced back about 10–15 mils from each side of the opening 22 of the segment 12.

Typically, the lamination of the various segments 10, 12 and 14 is accomplished by stacking the segments 10, 12 and 14 and strips 40 and 42 in alignment as shown in FIG. 2 in a laminating press. A plug or insert member 56 is also provided which has a cap 58 and a stem 60. The plug member 56 preferably is formed of the same material as the segments 10, 12 and 14, i.e., FR4 in the fully cured condition.

The plug member 56 is configured as follows. The size of the cap 58 is configured to be just slightly smaller than the size of the opening 20 in the segment 10 so that cap 58 fits into the opening 20 and the bottom surface 62 of the cap 58 rests against the exposed surface of the segment 12 around the opening 22 as shown in FIGS. 2 and 2A. The thickness of the cap 58 is substantially the same as the thickness of the segment 10 plus the thickness of the B cured prepreg strip 40 so that when the cap 58 is resting on the top surface of the segment 12, the top surface of the segment 10 is essentially flush with or just slightly below (e.g., a few ten-thousandths of an inch) top surface 63 of the cap 58 as shown in FIG. 2. The length of the stem 60 projecting from the cap is substantially equal to the thickness of the segment 12, plus the thickness of the segment 14, plus the thickness of the prepreg strip 42 such that the bottom surface 64 is substantially flush with or just slightly above (e.g., a few ten-thousandths of an inch) the bottom surface of the segment 14. Moreover, the size of the stem 60 is just slightly smaller than the size of the opening 24 in the segment 14.

In this configuration, the segments 10, 12 and 14 and glass strips 40 and 42 are laid up in the laminating press with the plug 56 inserted as shown in FIG. 2. The segments 10, 12 and 14 are laminated using conventional laminating techniques of heat and pressure. The laminating platens are shown in FIG. 2 and indicated by reference character "P". The particular temperatures and pressures used during lamination are well known in the art.

During the lamination process, there is a certain amount of flow of the epoxy resin that is impregnated into the glass strips 40 and 42. The amount of flow will depend upon various factors, such as pressure and temperature used as well as the amount of epoxy used to impregnate the prepreg sheets 40, 42 and other properties of the epoxy and as glass transition temperature (Tg). One typical epoxy has a Tg of about 134° C., another of about 170° C. In any event, some flow will occur which will be dependent upon the various factors such as temperatures and pressures used in laminating.

During the lamination process, the epoxy on the glass strip 42 will flow; however, as indicated previously, the edge of the opening 46 is spaced from the edge of the opening 22 in the segment 12 by about 10–15 mils. This spacing is important for the following reasons. The edge of the strip 42 around the opening 46 therein must be close enough to the opening 22 so that when it flows, it will not leave any significant void regions or unbounded regions since void or unbonded regions are detrimental in future processing steps in that chemicals can enter causing shorting and other deleterious effects. On the other hand, the edge of the opening 46 of the strip 42 cannot be so close to the edge of the segment 12 around opening 22 as to flow out and substantially cover the bonding pads 38 which are on top of the segment 14. These bonding pads 48 extend approximately 50–60 mils beyond the edge 22 of the segment 12 and are exposed. By spacing the edge of the strip 42 around the opening 46 therein a distance of 10–15 mils from the edge of the opening 22, selecting the desired epoxy and the amount of epoxy impregnated in the fiberglass cloth, and controlling the temperature and pressure of lamination, a flow will occur such that the epoxy on the strip 42 will extend out over the bonding pads 38 a distance of 1–2 mils. It is necessary that there be at least some outward flow onto the bonding pads 38 to ensure that there is no voiding or void spaces between the segments 12 and 14, but the flow must not be so much as to cover the bonding pads 38 and prevent bonding of a chip thereon.

The edges of the opening 44 in the glass strip 40 are spaced back from the edges of the opening 20 in the segment 10 about 10–15 mils. However, there will be a certain small amount of flow of the epoxy impregnated in the sheet 40 out from under the segment 10 which will flow around the cap 58 of the plug 56. As described above, it is critical that there be enough flow to prevent voiding, but not too much to completely and tightly bond to the plug 56, but enough to form a loose bond therewith. Thus, during the curing and cooling, this will form a bond with the cap 58 which will maintain the plug 56 in place as will be described presently. This flow does not constitute a large amount of material and hence an extremely strong bond is not formed between the plug 56 and the segments 10 and 12, but the bond is strong enough to maintain the insert in place during subsequent processing, following which it can be relatively easily removed without damage to the segments 10, 12 or 14.

The criticality of the height of the plug 56 can be best understood by understanding certain of its functions. One of the functions of the plug 56 is to provide pressure between the segment 12 and the segment 14 in that region where they are in contact and the segment 12 extends out from the opening 20 in the segment 10. By controlling the thickness of the cap 58 so that the top of the cap 58 is flush or very close to being flush with the top of the segment 10 and the bottom of the stem 60 is flush or close to being flush with the bottom of the segment 14, when pressure is applied during lamination, as shown in FIG. 2, the cap 58 will exert pressure on the portion of the segment 12 which extends out from the opening 20 in the segment 10, thus causing a uniform pressure to be applied to the entire surface of the segment 12 during the lamination process. Moreover, the stem 60 being flush with the bottom surface of the segment 14 assures that the pressure will be maintained uniformly across the cap 58 of the plug 56. If the stem 60 were not in place, the action of the platen on the cap 58 would tend to increase the pressure around the edge of the opening 22 and might thereby crush the bonding pads 38 or underlying circuitry 36. By providing a stem 60, a uniform pressure is generated across the entire lay-up of the segments 10, 12 and 14, and strips 40 and 42.

After the laminating cycle of the heat and pressure is completed, the laminated segments 10, 12 and 14 are removed from the laminating press. After laminating, the segments 10, 12 and 14 together with the sheets 40 and 42 become a unitary structure. However, in FIGS. 3–5, the various components are separately delineated. The plug 56 will remain therein due to the adhesive nature of the epoxy which flowed from the prepreg strip 40 around the cap 58 of the plug 56 as previously described as shown in FIG. 3. Thus, the plug 56 will have served one of its purposes in the laminating process, i.e., the purpose of equalizing pressure during the laminating process on the various segments 10, 12 and 14 being laminated.

At this point in the process, vias or through holes 65 are drilled as shown in FIG. 3, and the laminated segments 10, 12 and 14 are circuitized. (It is to be understood that there normally will be many vias or through holes, but only two are shown for clarity of illustration.) The circuitization process according to the present invention is an additive plating technique utilizing dry film resist technology, i.e., it uses sheets of photoresist material which are applied as sheets in the dry, solid form as opposed to a liquid photoresist which is sprayed on and uniformly coats and the plating is either electrolytic or electrollus plating.

Referring now to FIG. 4, a technology for circuitizing the laminated segments 10, 12 and 14 utilizing additive plating processes and negative acting photoresist is shown. The laminated segments 10, 12 and 14 which have been bonded into a unitary circuit board substrate as shown in FIG. 4 are first seeded for electrolass plating in a well known manner, and thereafter have applied to the opposite sides thereof sheets of dry photoresist 66 and 68. In one embodiment, dupont Photoresist 3120 is used, in another embodiment dupont T168 photoresist is used. Both of these are negative acting resists, i.e., they will be developed and washed away after development where not exposed by actinic radiation.

One of the difficulties encountered when using dry resist techniques is that the photoresist must arch or tent over all openings in the substrate structure and remain in such a condition during the subsequent processes of exposing and developing the resist and circuitizing the substrate. While the photoresist can span relatively small openings, such as the holes 65 and maintain its integrity for the entire process, such is not the case for openings of the size of openings 20 and 24 in the segments 10 and 14, respectively. If a photoresist were to span these openings, which as indicated above can be up to an inch or more in width, the resist in most cases during subsequent processing steps of exposure, developing and circuitization would lose its integrity and allow the chemicals used for these processes or subsequent processes to enter into the openings 20, 22 and 24 which could result in damage to or degradation of the bonding pads 38.

The plug 56 acts as a support for both films of the resist 66 and 68 during subsequent processing, allowing the resist to tent over the openings 20 and 24 during subsequent exposure, develop and circuitization operations, thus sealing the interior of the laminated segments 10, 12 and 14 defined by the openings 20, 22 and 24. This will protect the bonding pads 38 from being exposed to the different chemicals during the subsequent operations. Thus, the plug 56, having previously served the purpose of providing even distribution of the laminating forces, now serves the purpose to support the photoresist during subsequent operations.

Figure 6:
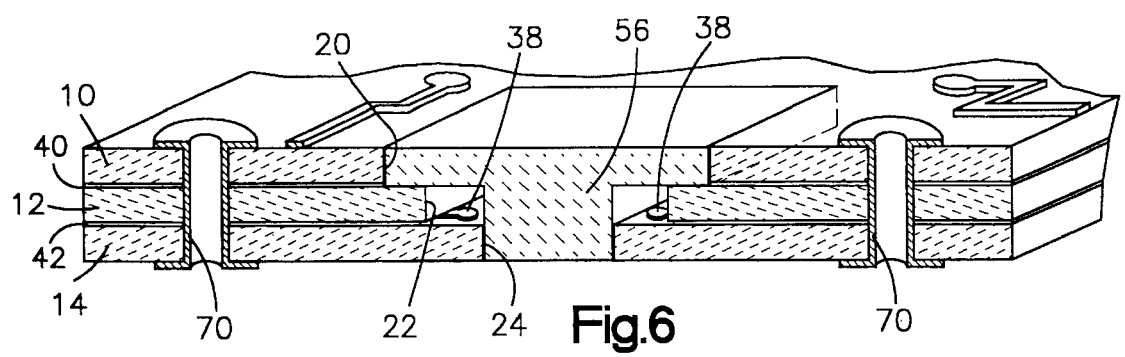
FIG. 6 is a view similar to FIG. 5 showing the circuitized product.
Figure 7:
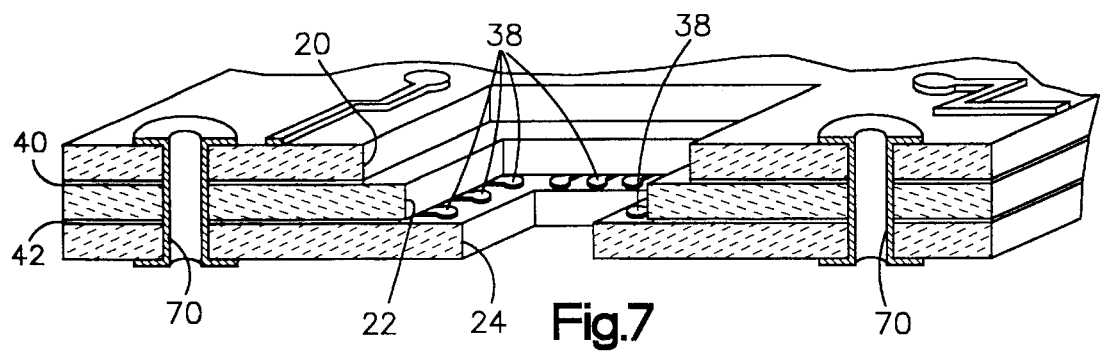
FIG. 7 is a view similar to FIG. 6 showing the circuitized product with the plug removed.

The photoresist sheets 66 and 68 are exposed and developed as shown in FIG. 5 using conventional photolithographic techniques to reveal the underlying areas where metalization is to be applied. According to conventional metalization practices, the exposed areas are metalized, to provide circuitization 69 on the top surface of segment 10. The metalization also deposits in the holes 65, which holes then become plated-through holes with metal 70 therein. The resist is then removed to provide a product as shown in FIG. 6. At this point, the insert or plug 56 can be removed as shown in FIG. 7.

Figure 8:
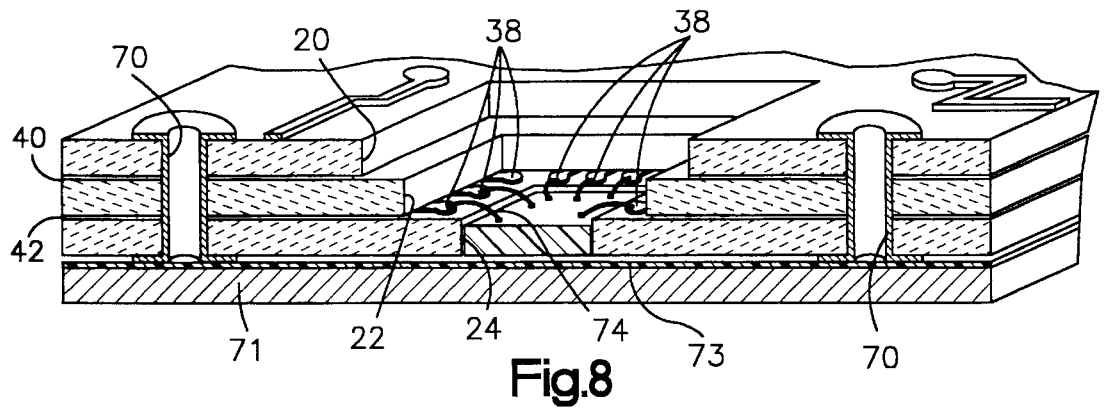
FIG. 8 is a view similar to FIG. 7 showing an integrated circuit chip attached.

This configuration of a single carrier module laminate is then ready to receive a ground plane of copper sheet 71 and an integrated circuit chip 72 as shown in FIG. 8. The chip 72 is bonded by an adhesive 73 on one side thereof to the ground plane 71. The ground plane has appropriate openings (not shown) to prevent contact with the plated through holes 65 and any components on the surface of segment 14. The adhesive 73 also acts to bond the ground plane 71 to the surface of the segment 14, which ground plane 71 also acts as a heat sink. The chip 72 is bonded by wire bonds 74 to the pads 38, thus completing the chip carrier structure.

Other plating and/or photolithographic techniques can be used. For example, positive acting resist can be employed instead of negative acting.

It is also to be understood that in the described preferred embodiment, the present invention was described in conjunction with a laminated structure using epoxy-filled fiberglass cloth. However, the invention can be used with other laminating techniques. Where pressure is used in the laminating structure, the insert or plug 56 can be used for distributing pressure evenly during the lamination process; however, if other lamination process are used, such as with ceramic carriers which do not rely on pressure, nevertheless the insert or plug 56 can still be effectively used if photoresist technology is used for circuitization in this case, the plug supports the dry film resist as described previously. The plug 56 can also be used in this respect, as well as during certain lamination procedures if required in the use of polyimide technology for forming these laminates.

As indicated previously, this invention is particularly useful in forming chip carriers, either SCML or MCML. However, in a broad sense, the same technique is applicable generally for attachment of chips to circuitized boards.

Accordingly, the preferred embodiment(s) of the present invention has been described. With the foregoing description in mind, however, it is understood that this description is made only by way of example, that the invention is not limited to the particular embodiments described herein, and that various rearrangements, modifications, and substitutions may be implemented without departing from the scope of the invention as hereinafter claimed.

What is claimed is:

1. A laminated structure comprising first, second and third substrates formed of an organic material, said substrates having respectively first, second and third through openings therein in an aligned configuration, said first opening being smaller than said second opening to thereby form a first step on said first substrate about the perimeter of said first opening, said second opening being smaller than said third opening to thereby form a second step on said second substrate about the perimeter of said second opening, a metallic ground plane laminated to and substantially covering said first substrate, an integrated circuit chip supported by said ground plane and defined in said first opening, and bonding pads located on said first step and connected by circuitry located on said first substrate to said integrated circuit chip.

2. The device of claim 1 wherein said substrates are formed of epoxy impregnated fiberglass.

3. The device of claim 2 wherein said substrates are bonded together by sheets of epoxy impregnated fiberglass.

4. The device of claim 1 further characterized by wire bonds connecting said integrated circuit chip with said bonding pads.

5. The device of claim 1 further characterized by said second step being free of circuitry.

6. A laminated structure comprising first, second and third substrates formed of an organic material, said substrates having respectively first, second and third through openings therein in an aligned configuration, said first opening being smaller than said second opening to thereby form a first step on said first substrate about the perimeter of said first opening, said second opening being smaller than said third opening to thereby form a second step on said second substrate about the perimeter of said second opening, a film of material located on the surface of said third substrate overlying said third opening, bonding pads located on said first step and being connected to circuitry located on said first substrate, said second step arranged to support a removable plug, said removable plug comprising a head portion and a stem portion, said removable plug disposed within said third opening and at least partially supported by said second step, and said head portion of said removable plug having a support surface in coplanar contact with said film of material.

7. The device of claim 6 wherein said substrates are formed of epoxy impregnated fiberglass.

8. The device of claim 7 wherein said substrates are bonded together by sheets of epoxy impregnated fiberglass.

9. The device of claim 6 further characterized by said second step being free of circuitry.

10. The device of claim 6 further characterized by said film of material being dry photoresist.

* * * * *